United States Patent
Yamaguchi et al.

(10) Patent No.: US 11,398,771 B2
(45) Date of Patent: *Jul. 26, 2022

(54) SWITCHING REGULATOR CONTROL CIRCUIT ENABLING FAULT PROTECTION OPERATION, CURRENT-MODE-CONTROL SWITCHING POWER SUPPLY DEVICE, AND VEHICLE

(71) Applicant: Rohm Co., Ltd., Kyoto (JP)

(72) Inventors: Yuhei Yamaguchi, Kyoto (JP); Tetsuo Tateishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/669,091

(22) Filed: Oct. 30, 2019

(65) Prior Publication Data

US 2020/0136496 A1 Apr. 30, 2020

Related U.S. Application Data

(63) Continuation of application No. 15/390,815, filed on Dec. 27, 2016, now Pat. No. 10,491,099.

(30) Foreign Application Priority Data

Dec. 28, 2015 (JP) ................................. 2015-256555
Aug. 22, 2016 (JP) ................................. 2016-162121

(51) Int. Cl.
*H02M 1/32* (2007.01)
*H02M 1/088* (2006.01)
(Continued)

(52) U.S. Cl.
CPC ........... *H02M 1/088* (2013.01); *B60R 16/033* (2013.01); *H02H 7/1213* (2013.01); *H02M 1/32* (2013.01);
(Continued)

(58) Field of Classification Search
CPC .......... H02M 1/08; H02M 1/088; H02M 1/32; H02M 1/36; H02M 2001/0003;
(Continued)

(56) References Cited

U.S. PATENT DOCUMENTS 5,847,554 A 12/1998 Wilcox et al.
6,166,528 A 12/2000 Rosetti et al.
(Continued)

FOREIGN PATENT DOCUMENTS

JP H06-188082 7/1994
JP 2001-092314 4/2001
(Continued)

OTHER PUBLICATIONS

Office Action issued in Japanese Application No. 2016-162121 dated Jun. 8, 2020 (with partial translation).
(Continued)

*Primary Examiner* — Thienvu V Tran
*Assistant Examiner* — Carlos O Rivera-Perez
(74) *Attorney, Agent, or Firm* — Fish & Richardson P.C.

(57) ABSTRACT

A switching regulator control circuit is used in a switching regulator that converts an input voltage into an output voltage by the switching of a switching device, and generates a switching signal for controlling the ON/OFF operation of the switching device. The switching regulator control circuit has a fault detector and a fault protector. The fault detector detects, based on the duty ratio of the switching signal or a variable correlated to it and included in a control signal used to generate the switching signal, a fault state where the duty ratio falls outside the normal modulation range. The fault protector stops the switching of the switching device when the fault detector detects a fault state.

22 Claims, 13 Drawing Sheets

(51) Int. Cl.
  *H03K 17/082* (2006.01)
  *H02M 3/158* (2006.01)
  *B60R 16/033* (2006.01)
  *H02H 7/12* (2006.01)
  *H02M 1/00* (2006.01)

(52) U.S. Cl.
  CPC .......... *H02M 3/158* (2013.01); *H03K 17/082* (2013.01); *H02M 1/0009* (2021.05); *H02M 1/0025* (2021.05)

(58) Field of Classification Search
  CPC ... H02M 2001/0009; H02M 2001/0016–0022; H02M 2001/0025; H02M 2001/0038; H02M 3/02; H02M 3/04; H02M 3/10; H02M 3/135; H02M 3/137; H02M 3/139; H02M 3/142; H02M 3/145; H02M 3/155; H02M 3/156; H02M 3/157; H02M 3/158; H02M 3/1582; H02M 3/1588; H02M 3/33507; H02M 3/33515; H02M 3/33546; H02M 1/0003; H02M 1/0009; H02M 1/0016–0022; H02M 1/0025; H02M 1/0038; H03K 17/08; H03K 17/082; H03K 17/0822; H03K 17/0826; H03K 17/0828; B60R 16/02; B60R 16/03; B60R 16/033; H02H 7/10; H02H 7/12; H02H 7/1213
  USPC ... 361/18, 78, 79, 86, 87, 88–92, 93.1, 93.2, 361/93.9, 94–97; 323/222–226, 271–278, 323/282–286, 351; 363/50, 56.03–56.12
  See application file for complete search history.

(56) References Cited

U.S. PATENT DOCUMENTS

| 10,491,099 B2* | 11/2019 | Yamaguchi .......... H02M 1/088 |
| 2007/0252567 A1 | 11/2007 | Dearn |
| 2009/0302816 A1 | 12/2009 | Kunimatsu |
| 2012/0049829 A1* | 3/2012 | Murakami .............. H02M 1/32 323/288 |
| 2012/0292989 A1* | 11/2012 | Kim ....................... H02M 1/32 307/10.1 |
| 2015/0002112 A1 | 1/2015 | Tang et al. |
| 2015/0244262 A1* | 8/2015 | Ouyang ................. H02M 1/08 323/283 |
| 2015/0280544 A1 | 12/2015 | Mishelevich |
| 2016/0118888 A1 | 4/2016 | Xu |
| 2016/0380567 A1 | 12/2016 | Grafling |
| 2017/0126135 A1 | 5/2017 | Sugawara |
| 2017/0179828 A1 | 6/2017 | Tang et al. |
| 2017/0179830 A1 | 6/2017 | Tang et al. |

FOREIGN PATENT DOCUMENTS

| JP | 2010-220355 | 9/2010 |
| JP | 2014-003850 | 1/2014 |

OTHER PUBLICATIONS

European Patent Office; Extended European Search Report dated May 17, 2017 in corresponding European Patent Application No. 16206497.6.

Hangseok C., et al., "Flyback Converter Protection Scheme with a Selective Shutdown Delay Time" IEEE , pp. 2192-2196 (2006).

\* cited by examiner

| | | V$_{IN}$(V) | | | | |
|---|---|---|---|---|---|---|
| | | 20 | 30 | 40 | 50 | 60 |
| F$_{zero}$ (kHz) | 20 | 138 | 92 | 70 | 56 | 46 |
| | 40 | 148 | 98 | 74 | 59 | 49 |
| | 60 | 156 | 104 | 78 | 62 | 52 |
| | 80 | 164 | 110 | 82 | 65 | 55 |
| | 100 | 172 | 115 | 86 | 68 | 58 |
| PULSE WIDTH (ns) IN STABLE OPERATION | | 119 | 79 | 60 | 48 | 40 |

SWITCHING REGULATOR CONTROL CIRCUIT ENABLING FAULT PROTECTION OPERATION, CURRENT-MODE-CONTROL SWITCHING POWER SUPPLY DEVICE, AND VEHICLE

This application is a continuation of U.S. application Ser. No. 15/390,815 filed Dec. 27, 2016 which claims priority under 35 U.S.C. § 119(a) on Patent Application No. 2015-256555 filed in Japan on Dec. 28, 2015 and Patent Application No. 2016-162121 filed in Japan on Aug. 22, 2016, the entire contents of which are hereby incorporated by reference.

BACKGROUND OF THE INVENTION

1. Field of the Invention

The present invention relates to switching regulators.

2. Description of Related Art

Methods for controlling switching power supply devices (switching regulators) that stabilize the output voltage by varying the duty ratio of the switching signal according to extraneous disturbances such as variation of the input voltage and variation of the output current divide roughly into those relying on voltage mode control and those relying on current mode control. In general, methods relying on current mode control are highly effective in terms of simple phase compensation, fast response, and reduced numbers of externally fitted components. An example of a common configuration of a current-mode-control switching power supply device is shown in FIG. 11.

The switching power supply device 100 shown in FIG. 11 performs current mode control by sensing the current through a low-side MOS (metal-oxide semiconductor) transistor Q2. Through the current mode control, a high-side MOS transistor Q1 and the low-side MOS transistor Q2 are turned ON and OFF complementarily, and by this switching operation, an input voltage $V_{IN}$ is converted into a pulsating switching voltage $V_{SW}$. The switching voltage $V_{SW}$ is then smoothed by an inductor L1 and a output capacitor C1, and is thereby converted into an output voltage $V_{OUT}$ lower than the input voltage $V_{IN}$.

For example, in switching power supply devices for vehicle-mounted applications, fast switching operation at 2 MHz or more is required to avoid producing noise in the AM radio frequency band. In the switching power supply device 100 shown in FIG. 11, suppose, for example, the input voltage $V_{IN}$ is set at 48 [V], the output voltage $V_{OUT}$ at 3.3 [V], and the switching frequency f at 2 [MHz], then the pulse width W of the switching voltage $V_{SW}$ during stable operation equals 34 [ns] as given by the following formula.

$$W = \frac{1}{f} \times \frac{V_{OUT}}{V_{IN}} = \frac{1}{2\,[\text{MHz}]} \times \frac{3.3\,[\text{V}]}{48\,[\text{V}]} = 34\,[\text{ns}]$$

In the switching power supply device 100 shown in FIG. 11, overcurrent protection operation is performed based on an overcurrent sense signal OC that is generated when an overcurrent through the high-side MOS transistor Q1 is sensed. However, with the settings noted above, the period in which the high-side MOS transistor Q1 is ON lasts as little as 34 [ns], making it impossible to sense an overcurrent through the high-side MOS transistor Q1.

Incidentally, like the switching power supply device 100 shown in FIG. 11, the current-mode-control switching power supply device disclosed in Japanese Patent Application published as No. 2014-003850 performs overcurrent protection operation by sensing an overcurrent through a high-side switching device, and thus suffers from a similar problem.

One approach to solve the problem is to modify the configuration so that overcurrent protection operation is performed based on an overcurrent through a low-side MOS transistor Q2. When an overcurrent is being sensed, the output voltage $V_{OUT}$ of the switching power supply device 100 is low; thus, unless a limit is provided for the pulse width W of the switching voltage $V_{SW}$, when the high-side MOS transistor Q1 is turned ON on recovery from the overcurrent, the ON period of the high-side MOS transistor Q1 is prolonged without a limit. To avoid that, a configuration is added whereby, when the output voltage $V_{OUT}$ is low, the pulse width W of the switching voltage $V_{SW}$ is limited. Here, an overcurrent state can be either a state where the overcurrent results from a short circuit in the load or a state where it results from a short circuit at the connection node between the high-side and low-side MOS transistors Q1 and Q2. In the state where the overcurrent results from a short circuit at the connection node between the high-side and low-side MOS transistors Q1 and Q2, no current is present through the low-side MOS transistor Q2. Thus, with a configuration that performs overcurrent protection operation based solely on an overcurrent through the low-side MOS transistor Q2, it is not possible to detect a state where an overcurrent results from a short circuit at the connection node between the high-side and low-side MOS transistors Q1 and Q2. That is, in a state where an overcurrent results from a short circuit in the load, the pulse width W of the switching voltage $V_{SW}$ is limited and in addition an overcurrent through the low-side MOS transistor Q2 is sensed; in contrast, in a state where an overcurrent results from a short circuit at the connection node between the high-side and low-side MOS transistors Q1 and Q2, the pulse width W of the switching voltage $V_{SW}$ is limited but no overcurrent through the low-side MOS transistor Q2 is sensed. Performing overcurrent protection operation in a state where the pulse width W of the switching voltage $V_{SW}$ is limited but no overcurrent through the low-side MOS transistor Q2 is sensed requires a technology that enables overcurrent protection operation without direct of a sensing result from a current sensing device. Incidentally, any technology that enables fault protection operation without direct use of a sensing result from a sensing device for sensing a physical quantity, not limited to an overcurrent as described above, as the target of fault detection would be highly useful.

SUMMARY OF THE INVENTION

An object of the present invention is to provide a switching regulator that can perform fault protection operation without direct use of a sensing result from a sensing device for sensing a physical quantity as the target of fault detection.

According to one aspect of what is disclosed herein, a switching regulator control circuit as is used in a switching regulator that converts an input voltage into an output voltage by the switching of a switching device in order to generate a switching signal for controlling the ON/OFF operation of the switching device includes: a fault detector configured to detect, based on the duty ratio of the switching signal or a variable correlated to the duty ratio and included in a control signal used to generate the switching signal, a fault state where the duty ratio falls outside the normal modulation range; and a fault protector configured to stop the switching of the switching device when the fault detector detects the fault state.

According to another aspect of what is disclosed herein, a current-mode-control switching power supply device includes: a first switch having a first terminal thereof connected to a first application terminal to which an input voltage is applied; a second switch having a first terminal thereof connected to a second terminal of the first switch and having a second terminal thereof connected to a second application terminal to which a voltage lower than the input voltage is applied; a current sensor configured to sense the current through the second switch; an overcurrent sensor configured to sense an overcurrent through the second switch; and a controller configured to control the first and second switches according to the current sensed by the current sensor. Here, the controller includes a slope voltage generator configured to accumulate information on the current sensed by the current sensor during a predetermined period in which the first switch is OFF to generate a slope voltage based on the accumulated information on the current, and the controller is configured to control the first and second switches according to the slope voltage. Moreover, the controller is configured to limit to a fixed width the pulse width of a pulse occurring in a switching signal for controlling the ON/OFF operation of the first and second switches if continuing to control the first and second switches according to the slope voltage causes the pulse width of the pulse occurring in the switching signal to exceed the fixed width. Furthermore, the controller is configured to inhibit any pulse from occurring in the switching signal during a period in which an overcurrent is sensed by the overcurrent sensor and to stop the ON/OFF operation of the first switch to turn the first switch OFF when a plurality of pulses with the fixed width are occurring successively in the switching signal at the switching frequency of normal operation.

According to yet another aspect of what is disclosed herein, a vehicle-mounted appliance includes a switching regulator including a switching regulator control circuit configured as described above along with a switching device whose ON/OFF operation is controlled by a switching signal output from the switching regulator control circuit, or includes a current-mode-control switching power supply device configured as described above.

According to still another aspect of what is disclosed herein, a vehicle includes a vehicle-mounted appliance configured as described above along with a battery for supplying the vehicle-mounted appliance with electric power.

The significance and effect of the present invention will become clear from the description of embodiments that follows. It should however be understood that the embodiments disclosed herein are merely examples of how the present invention can be implemented, and that the meanings of the terms referring to various elements and features of the present invention are not limited to those in which those terms are used in the following description of embodiments.

BRIEF DESCRIPTION OF THE DRAWINGS

FIG. 14 is a three-dimensional plot of maximum pulse widths of the switching signal with consideration given to circuit variations and the like;

DETAILED DESCRIPTION OF PREFERRED EMBODIMENTS

Figure 1:
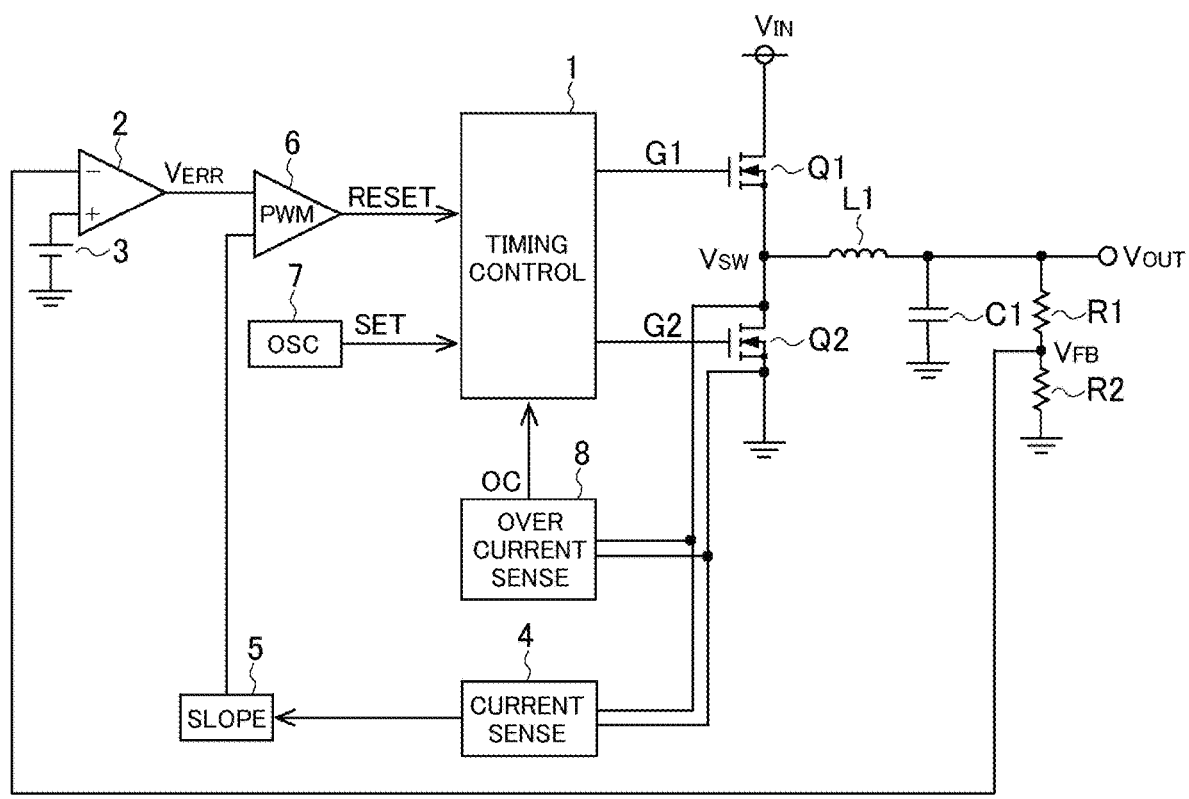
FIG. 1 is a diagram showing an example of the overall configuration of a switching power supply device.

Overall Configuration:

FIG. 1 is a diagram showing an example of the overall configuration of a current-mode-control switching power supply device (current-mode-control switching regulator). The switching power supply device 101 of this configuration example is a current-mode-control switching power supply device that performs step-down operation to step down an input voltage, and includes a timing control circuit 1, a high-side MOS transistor Q1, a low-side MOS transistor Q2, an inductor L1, an output capacitor C1, voltage division resistors R1 and R2, an error amplifier 2, a reference voltage source 3, a current sense circuit 4, a slope circuit 5, a comparator 6, an oscillator 7, and an overcurrent sense circuit 8.

The timing control circuit 1 controls the ON/OFF states of the high-side and low-side MOS transistors Q1 and Q2, and generates gate signals G1 and G2 for the high-side and low-side MOS transistors Q1 and Q2 respectively according to a set signal SET and a reset signal RESET.

The high-side MOS transistor Q1 is an N-channel MOS transistor, and is one example of a high-side switch that connects or disconnect the current path from an input voltage application node, that is, a node to which an input voltage $V_{IN}$ is applied, to the inductor L1. The drain of the high-side MOS transistor Q1 is connected to the input voltage application node, to which the input voltage $V_{IN}$ is applied. The source of the high-side MOS transistor Q1 is connected to one end of the inductor and to the drain of the low-side MOS transistor Q2. To the gate of the high-side MOS transistor Q1, the gate signal G1 is fed from the timing control circuit 1. The high-side MOS transistor Q1 is ON when the gate signal G1 is at HIGH level, and is OFF when the gate signal G1 is at LOW level.

The low-side MOS transistor Q2 is an N-channel MOS transistor, and is one example of a low-side switch that connects or disconnects the current path from a ground node to the inductor L1. The drain of the low-side MOS transistor Q2 is, as mentioned above, connected to one end of the inductor and to the source of the high-side MOS transistor Q1. The source of the low-side MOS transistor Q2 is connected to the ground node. To the gate of the low-side MOS transistor Q2, the gate signal G2 is fed from the timing control circuit 1. The low-side MOS transistor Q2 is ON when the gate signal G2 is at HIGH level, and is OFF when the gate signal G2 is at LOW level. Instead of the low-side MOS transistor Q2, a diode may be used as a low-side switch, in which case a sense resistor needs to be provided in series with the diode so that the current sense circuit 4 senses the voltage across the sense resistor.

The high-side and low-side MOS transistors Q1 and Q2 are turned ON and OFF complementarily under the control of the timing control circuit 1. As a result, at the connection node between the high-side and low-side MOS transistors Q1 and Q2, a pulsating switching voltage $V_{SW}$ appears. It is preferable that the ON/OFF transition of the high-side and low-side MOS transistors Q1 and Q2 includes a dead time, that is, a period in which the high-side and low-side MOS transistors Q1 and Q2 are both OFF.

The inductor L1 and the output capacitor C1 smooth the pulsating switching voltage $V_{SW}$ to generate an output voltage $V_{OUT}$, and feeds the output voltage $V_{OUT}$ to a node to which the output voltage $V_{OUT}$ is to be applied.

The voltage division resistors R1 and R2 divide the output voltage $V_{OUT}$ to generate a feedback voltage $V_{FB}$.

The error amplifier 2 generates an error signal $V_{ERR}$ that is commensurate with the difference between the feedback voltage $V_{FB}$ and a reference voltage output from the reference voltage source 3.

The current sense circuit 4 senses the current through the low-side MOS transistor Q2 based on the drain-source voltage of the low-side MOS transistor Q2 in its ON state, that is, the voltage across the ON resistance of the low-side MOS transistor Q2.

The slope circuit 5 generates and outputs a slope voltage that is commensurate with the current through the low-side MOS transistor Q2 as sensed by the current sense circuit 4.

Figure 2:
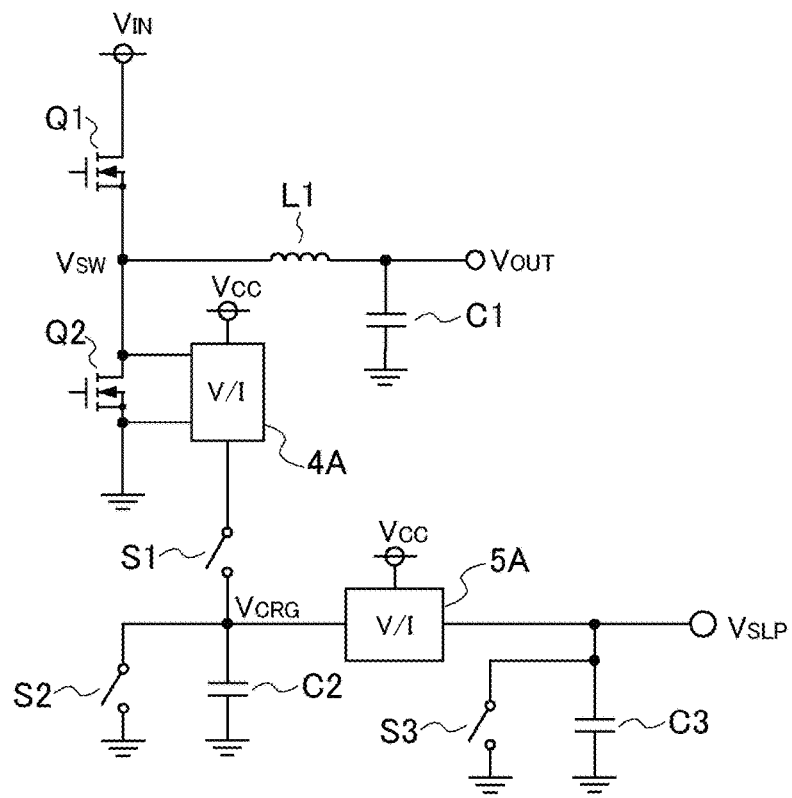
FIG. 2 is a diagram showing an example of the configuration of a current sense circuit and a slope circuit.
Figure 4:
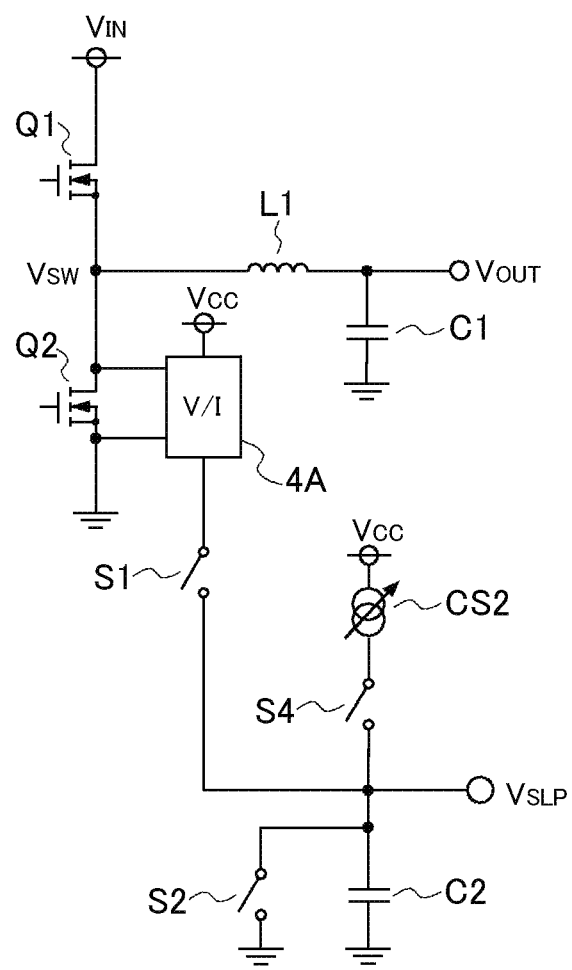
FIG. 4 is a diagram showing another example of the configuration of a current sense circuit and a slope circuit.

To generate the slope voltage such that the inclination of its slope reflects current information, the current sense circuits 4 and 5 can be configured, for example, as shown in FIG. 2. On the other hand, to generate the slope voltage such that the offset voltage of its slope reflects current information, the current sense circuits 4 and 5 can be configured, for example, as shown in FIG. 4.

In the example shown in FIG. 2, the current sense circuit 4 is configured as a voltage-current conversion circuit 4A. In the example shown in FIG. 2, the slope circuit 5 is composed of switches S1 to S3, capacitors C2 and C3, and a voltage-current conversion circuit 5A.

The voltage-current conversion circuits 4A and 5A are each a circuit that is driven by an internal supply voltage $V_{CC}$ which is generated within an IC (integrated circuit) that includes the timing control circuit 1, the error amplifier 2, the reference voltage source 3, the current sense circuit 4, the slope circuit 5, the comparator 6, the oscillator 7, and the overcurrent sense circuit 8.

The voltage-current conversion circuit 4A converts the drain-source voltage of the low-side MOS transistor Q2 into a current and outputs the current. When the switch S1 is ON, the output current of the voltage-current conversion circuit 4A charges the capacitor C2. On the other hand, when the switch S2 is ON, the capacitor C2 discharges.

The voltage-current conversion circuit 5A converts the charge voltage $V_{CRG}$ of the capacitor C2 into a current and outputs the current. The output current of the voltage-current conversion circuit 5A charges the capacitor C3. On the other hand, when the switch S3 is ON, the capacitor C3 discharges. The charge voltage of the capacitor C3 is taken as the slope voltage $V_{SLP}$.

Figure 3A:
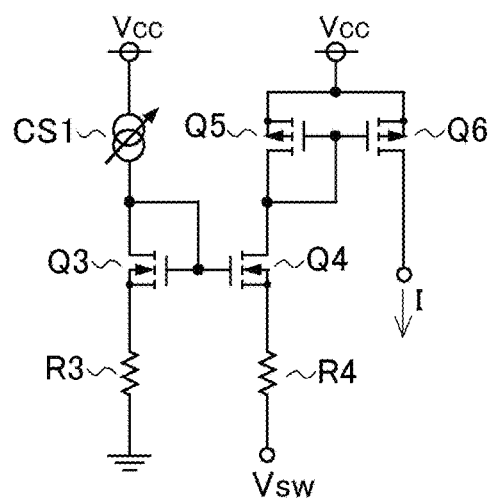
FIG. 3A is a diagram showing one example of the configuration of a voltage-current conversion circuit 4A.
Figure 3B:
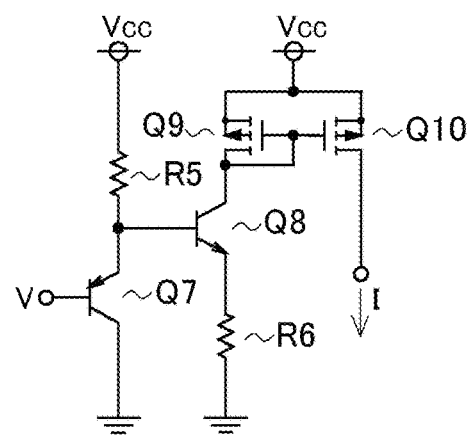
FIG. 3B is a diagram showing one example of the configuration of a voltage-current conversion circuit 5A.

FIGS. 3A and 3B are diagrams showing examples of the configuration of the voltage-current conversion circuits 4A and 5A respectively. In the voltage-current conversion circuit shown in FIG. 3A, a current source CS1 feeds a current to a current mirror circuit composed of N-channel MOS transistors Q3 and Q4. In a case where the mirror ratio of the current mirror circuit composed of the N-channel MOS transistors Q3 and Q4 is 1:1, the current through a resistor R4 has a value that is equal to the switching voltage $V_{SW}$ divided by the difference (r3−r4) between the resistance values of a resistor R3 and the resistance value of the resistor R4. Then, a current commensurate with the current through the resistor R4 (a current commensurate with the switching voltage $V_{SW}$, which is the input voltage to the voltage-current conversion circuit 4A) is, as the output current of the voltage-current conversion circuit 4A, swept out by a current mirror circuit composed of P-channel MOS transistors Q5 and Q6. In the voltage-current conversion circuit shown in FIG. 3B, a serial circuit of a resistor R5 and a PNP transistor Q7 produces, through the resistor R5, a current commensurate with the input voltage to the voltage-current conversion circuit, so that a voltage commensurate with the input voltage to the voltage-current conversion circuit appears at the connection node between the resistor R5 and the PNP transistor Q7. Moreover, a serial circuit of an NPN transistor Q8 and a resistor R6 produces, through the resistor R6, a current commensurate with the voltage at the connection node between the resistor R5 and the PNP transistor Q7 (a voltage commensurate with the input voltage to the voltage-current conversion circuit). Then a current commensurate with the current through the resistor R6 (a current commensurate with the input voltage V to the voltage-current conversion circuit 5A) is, as the output current of the voltage-current conversion circuit, swept out by a current mirror circuit composed of P-channel MOS transistors Q9 and Q10.

In the example shown in FIG. 4, the current sense circuit 4 is configured like the voltage-current conversion circuit 4A. Moreover, in the example shown in FIG. 4, the slope circuit 5 is composed of switches S1, S2, and S4, a capacitor C2, and a constant-current source CS2. It is preferable that the constant-current source CS2 output a constant current of which the value is adjustable.

The voltage-current conversion circuit 4A and the constant-current source CS2 are each a circuit that is driven by an internal supply voltage $V_{CC}$ which is generated within an IC (integrated circuit) that includes the timing control circuit 1, the error amplifier 2, the reference voltage source 3, the current sense circuit 4, the slope circuit 5, the comparator 6, the oscillator 7, and the overcurrent sense circuit 8.

The voltage-current conversion circuit 4A converts the drain-source voltage of the low-side MOS transistor Q2 into a current and outputs the current. The capacitor C2 is charged with the output current of the voltage-current conversion circuit 4A when the switch S1 is ON, and is charged with the output current of the constant-current source CS2 when the switch S4 is ON. On the other hand, when the switch S2 is ON, the capacitor C2 discharges. The charge voltage of the capacitor C2 is taken as the slope voltage $V_{SLP}$.

Next, with reference back to FIG. 1, a description of the switching power supply device 101 will be continued.

The comparator 6 compares the output voltage of the slope circuit 5 with an error signal $V_{ERR}$ to generate a reset signal RESET, which is a comparison signal. The slope voltage $V_{SLP}$ generated by the slope circuit 5 has a fixed period, and accordingly the reset signal RESET is a PWM (pulse-width modulation) signal.

The oscillator 7 generates a set signal SET, which is a clock signal with a predetermined frequency.

Based on the voltage that appears when the low-side MOS transistor Q2 is ON, the overcurrent sense circuit 8 senses an overcurrent when the current through the low-side MOS transistor Q2 exceeds a threshold value. By using the result of the sensing by the overcurrent sense circuit 8, the timing control circuit 1 performs overcurrent protection operation. The overcurrent protection operation will be described in detail later.

Figure 5:
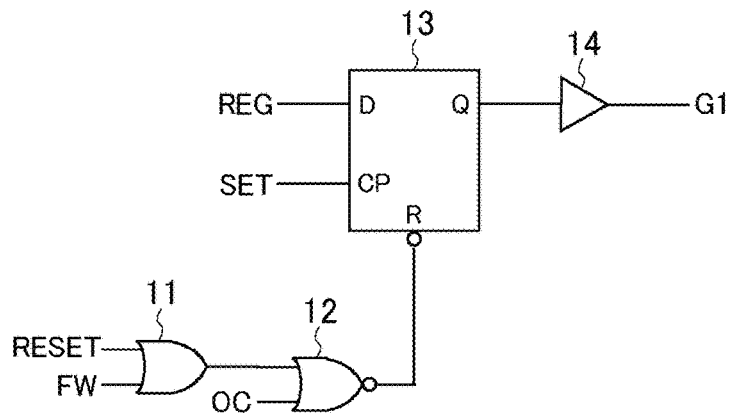
FIG. 5 is a diagram showing an example of the configuration of a principal portion of a timing control circuit.

A 1st Practical Example of Overcurrent Protection:

FIG. 5 is a diagram showing the configuration of a principal portion of the timing control circuit 1 in a first practical example of overcurrent protection. The timing control circuit 1 configured as shown in FIG. 5 includes an OR gate 11, a NOR gate 12, a D flip-flop 13, and an amplifier 14.

Figure 6:
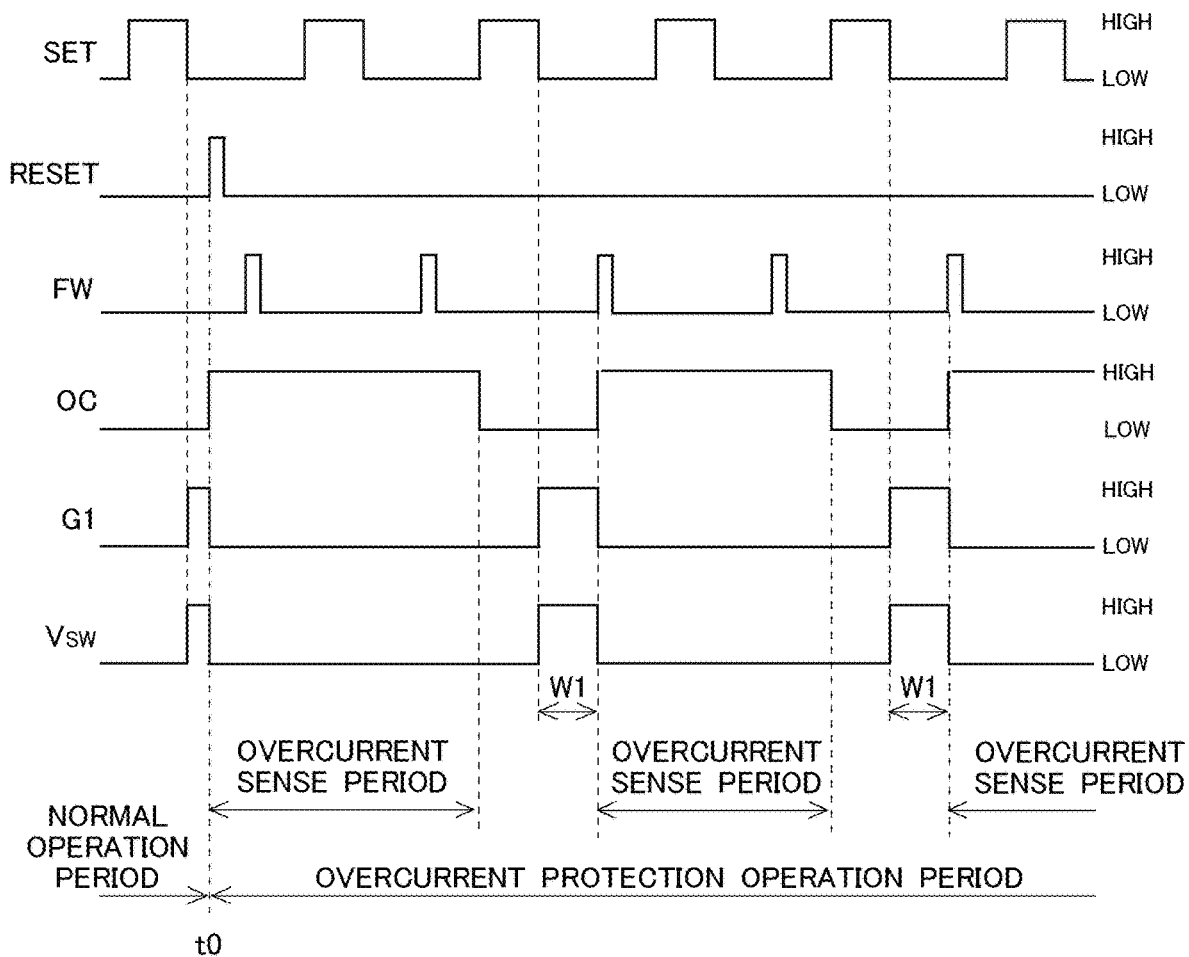
FIG. 6 is a timing chart showing an example of the operation of the timing control circuit shown in FIG. 5.

The OR gate 11 performs an OR operation (logical addition operation) between the reset signal RESET output from the comparator 6 and a fixed-width signal FW and outputs the result of the operation. The fixed-width signal FW is a signal that is generated within the timing control circuit 1, and is a pulse signal in which a pulse rises at the lapse of a predetermined time (the time corresponding to the fixed width W1 shown in FIG. 6) after a falling edge in the set signal SET output from the oscillator 7 (after the time point at which the set signal SET turns from HIGH level to LOW level). The just-mentioned predetermined time is set such that the fixed width W1 shown in FIG. 6 is larger than either of the maximum pulse widths of the gate signal G1 and the switching voltage $V_{SW}$ during normal operation.

Here, a description will be given of a method for setting the fixed width W1. Even during normal operation, the switching power supply device 101 suffers extraneous disturbances such as variation of the input voltage, variation of the output current, etc. However, the pulse widths of the gate signal G1 and the switching voltage $V_{SW}$ have to be prevented from being fixed at the fixed width W1 due to extraneous disturbances despite during normal operation. The approach adopted here to cope with that is to determine the fixed width W1 based on the zero-cross frequency Fzero of the total gain of the control system of the switching power supply device 101.

A high zero-cross frequency Fzero leads to fast response of the control system and deep modulation of the switching signal (gate signal G1); on the other hand, a low zero-cross frequency Fzero leads to slow response of the control system and shallow modulation of the switching signal (gate signal G1). Accordingly, different zero-cross frequencies Fzero are determined that fit different fields of application of the switching power supply device 101 (for example, the fields of vehicle-mounted applications, industrial machinery, and household appliances), and the maximum pulse width of the switching signal (gate signal G1) during stable operation is determined by use of simulation software.

Figures 12, 13:
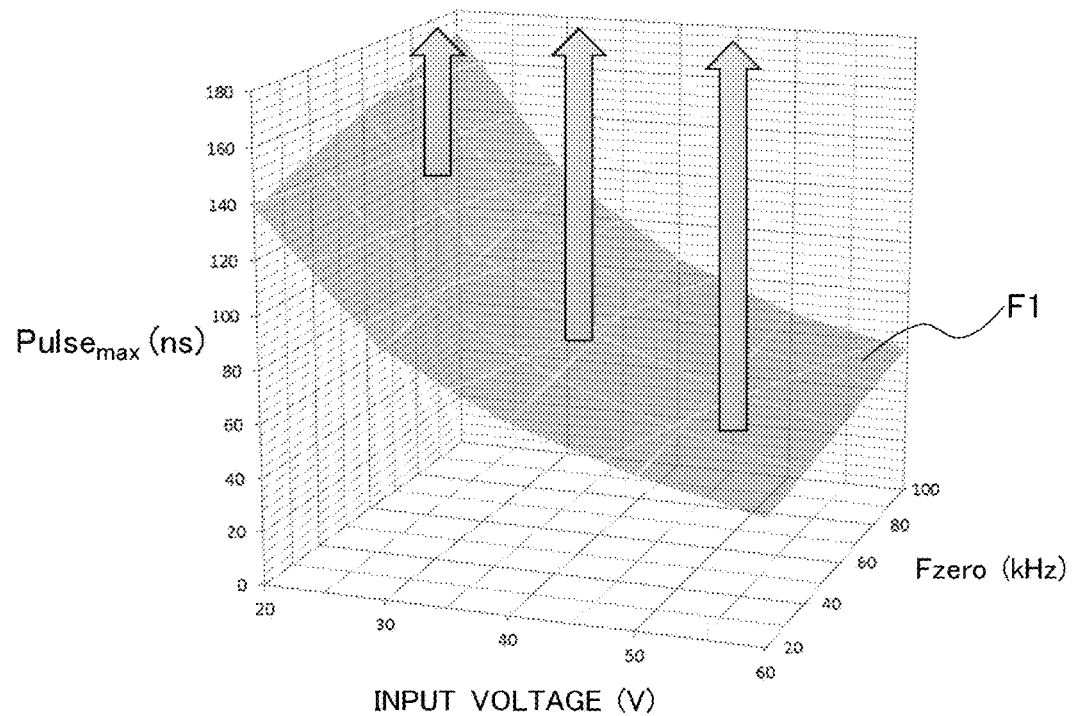
FIG. 12 is a diagram showing maximum pulse widths of a switching signal.
FIG. 13 is a three-dimensional plot of the maximum pulse widths of the switching signal shown in FIG. 12.

As one example of settings for the switching power supply device 101 when used in the field of vehicle-mounted applications, consider a case where the zero-cross frequency Fzero is set at 100 kHz, the input voltage $V_{IN}$ at 20 to 60 V, the output voltage $V_{OUT}$ at 5 V, the switching frequency at 2.1 MHz, and the output current $I_{OUT}$ at 0 to 1 A. With these settings, calculating the maximum pulse widths of the switching signal (gate signal G1) for different values of the zero-cross frequency Fzero in 20 kHz steps and different values of the input voltage $V_{IN}$ in 10 V steps gives values as shown in FIG. 12. FIG. 13 is a three-dimensional plot of the maximum pulse widths of the switching signal shown in FIG. 12. By setting the fixed width W1 in the region indicated by arrows in FIG. 13, that is, the region above the boundary face F1, it is possible to prevent the pulse widths of the gate signal G1 and the switching voltage $V_{SW}$ from being fixed at the fixed width W1 due to extraneous disturbances despite during normal operation.

Figure 14:
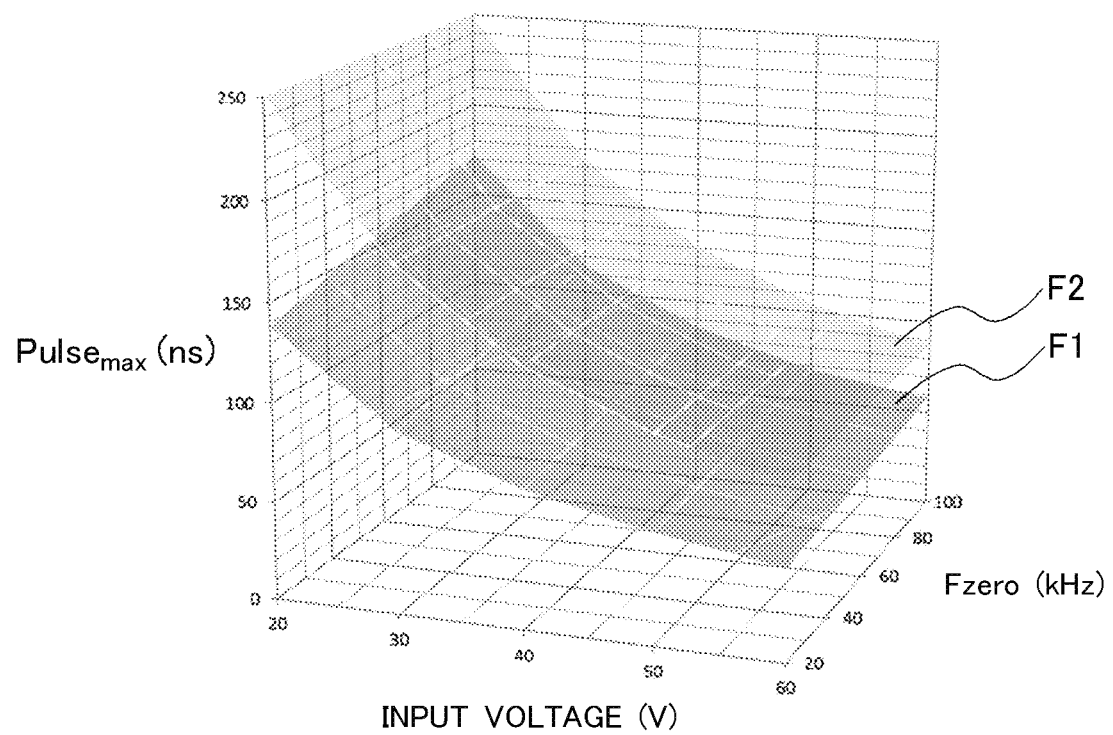

However, seeing that no consideration is given to circuit variations and the like in FIGS. 12 and 13, it is preferable, for example as shown in FIG. 14, to set the fixed width W1 in the region above the boundary surface F2 which describes 2.2 times the boundary face F1. In this way, the pulse widths of the gate signal G1 and the switching voltage $V_{SW}$ are prevented from being fixed at the fixed width W1 due to extraneously disturbances despite during normal operation.

The fixed width W1 may be a single value; or, considering that, as at least one of the input voltage $V_{IN}$ and the output voltage $V_{OUT}$ varies, the tolerable maximum ON duties of the gate signal G1 and the switching voltage $V_{SW}$ (the maximum pulse widths of the gate signal G1 and the switching voltage $V_{SW}$ that are tolerable during normal operation) vary, the value of the fixed width W1 may be a function of the input voltage $V_{IN}$ and the output voltage $V_{OUT}$. In this case, the timing control circuit 1 may include a storage for storing a functional expression and calculate the value of the fixed width W1 through calculation according to the function expression; or the timing control circuit 1 may have a storage for storing a data table defining the relationship between the value of the fixed width W1 and the values of the input voltage $V_{IN}$ and the output voltage $V_{OUT}$ and calculate the value of the fixed width W1 by referring to the data table.

Incidentally, it is not very practical to monitor the input voltage $V_{IN}$ and the output voltage $V_{OUT}$ on a real-time basis and vary the value of the fixed width W1 according to the input voltage $V_{IN}$ and the output voltage $V_{OUT}$; it is rather preferable to calculate the value of the fixed width W1 within assumed ranges of the input voltage $V_{IN}$ and the output voltage V OUT.

For example, in a case where the output voltage $V_{OUT}$ is set at a single value as in the above-mentioned example of settings, the value of the fixed width W1 is defined as a function of the input voltage $V_{IN}$ alone. In this case, for example, out of a plurality of set values of the fixed width W1, one that most suits the type of battery voltage used as the input voltage $V_{IN}$ may be selected.

For another example, in a case where one of a plurality of set values of the output voltage $V_{OUT}$ can be selected according to, for instance, the resistance value of a resistor externally fitted to the timing control circuit 1, then, for example, out of a plurality of set values of the fixed width W1, one that suits the set value of the output voltage $V_{OUT}$ can be selected.

The NOR gate 12 performs a NOR operation (negative logical addition) between the output signal of the OR gate 11 and the output signal OC of the overcurrent sense circuit 8 and outputs the result of the operation. On sensing the current through the low-side MOS transistor Q2 being higher than the threshold value, the overcurrent sense circuit 8 turns the output signal OC to HIGH level; on sensing the current through the low-side MOS transistor Q2 being not higher than the threshold value, the overcurrent sense circuit 8 turns the output signal OC to LOW level. The period in which the output signal OC is at HIGH level is the period in which the overcurrent sense circuit 8 is sensing an overcurrent.

A constant HIGH-level signal REG is fed to the data input terminal (D) of the D flip-flop 13; the set signal SET output from the oscillator 7 is fed to the clock pulse terminal (CP) of the D flip-flop 13; and the output signal of the NOR gate 12 is fed to the reset terminal (R) of the D flip-flop 13. At the time that the set signal SET turns from HIGH level to LOW level, the D flip-flop 13 holds the value of the data (constant signal REG) fed to its data input terminal (D). The signal output from the output terminal (Q) of the D flip-flop 13 is amplified by the amplifier 14 and is taken as the gate signal G1.

FIG. 6 is a timing chart showing an example of the operation of the timing control circuit 1 shown in FIG. 5. FIG. 6 shows operation observed in a situation where the switching power supply device 101 lapses into an ordinary overcurrent state at time t0 and the ordinary overcurrent state continues thereafter. Here, an ordinary overcurrent state refers to a state where the switching power supply device 101 suffers an overcurrent as a result of the switching power supply device 101 being overloaded by the load.

After time t0, the ordinary overcurrent state continues and the output voltage $V_{OUT}$ remains low; thus, once a pulse in the reset signal RESET resets the D flip-flop 13, no pulse appears in the reset signal RESET.

During the period in which overcurrent protection operation is in action, while the output signal OC of the overcurrent sense circuit 8 is at HIGH level, a LOW-level signal is kept fed to the reset terminal (R) of the D flip-flop 13, so that the gate signal G1 and the switching voltage $V_{SW}$ remain at LOW level.

On the other hand, during the period in which overcurrent protection operation is in action, while the output signal OC of the overcurrent sense circuit 8 is at LOW level, a falling edge in the set signal SET sets the D flip-flop 13 and a pulse in the fixed-width signal FW resets the D flip-flop 13, so that the pulse widths of the gate signal G1 and the switching voltage $V_{SW}$ are fixed at the fixed width W1.

Accordingly, during the period in which overcurrent protection operation is in action, the pulse widths of the gate signal G1 and the switching voltage $V_{SW}$ are fixed at the fixed width W1 and in addition the switching frequency is lower than during normal operation. This makes it possible to reduce the ON duty of the switching voltage $V_{SW}$. That is, while the ON/OFF operation of the high-side MOS transistor Q1 is controlled by the switching signal (gate signal G1), overcurrent protection operation is performed.

Figure 7:
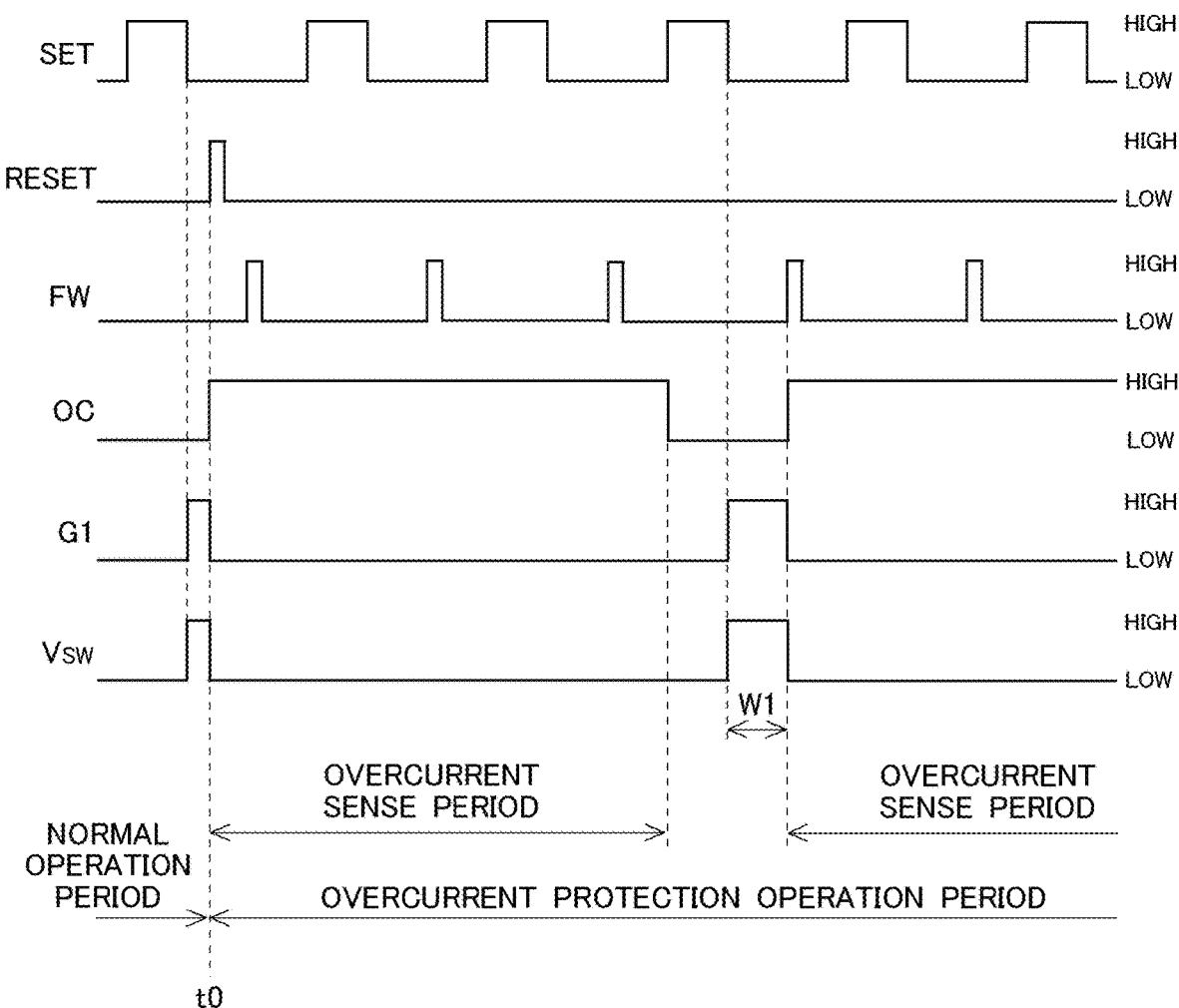
FIG. 7 is a timing chart showing another example of the operation of the timing control circuit shown in FIG. 5.

In FIG. 6, during a given continuous period in which the output signal OC of the overcurrent sense circuit 8 is at HIGH level, one pulse is skipped from each of the gate signal G1 and the switching voltage $V_{SW}$. This is merely one example. In a case where simply skipping one pulse from each of the gate signal G1 and the switching voltage $V_{SW}$ does not make the current through the high-side MOS transistor Q1 lower than the threshold value, then, for example as in the timing chart shown in FIG. 7, during a given continuous period in which the output signal OC of the overcurrent sense circuit 8 is at HIGH level, a plurality of pulses can be skipped from each of the gate signal G1 and the switching voltage $V_{SW}$.

A 2nd Practical Example of Overcurrent Protection:

As described above, the overcurrent sense circuit 8 is a circuit that checks whether or not the current through the low-side MOS transistor Q2 exceeds the threshold value. Accordingly, with the above-described first practical example of overcurrent protection, an overcurrent state that occurs when the load is short-circuited can be coped with by overcurrent protection operation, but an overcurrent state that occurs when the connection node between the high-side and low-side MOS transistors Q1 and Q2 is short-circuited to the ground potential cannot be coped with by overcurrent protection operation.

Figure 11:
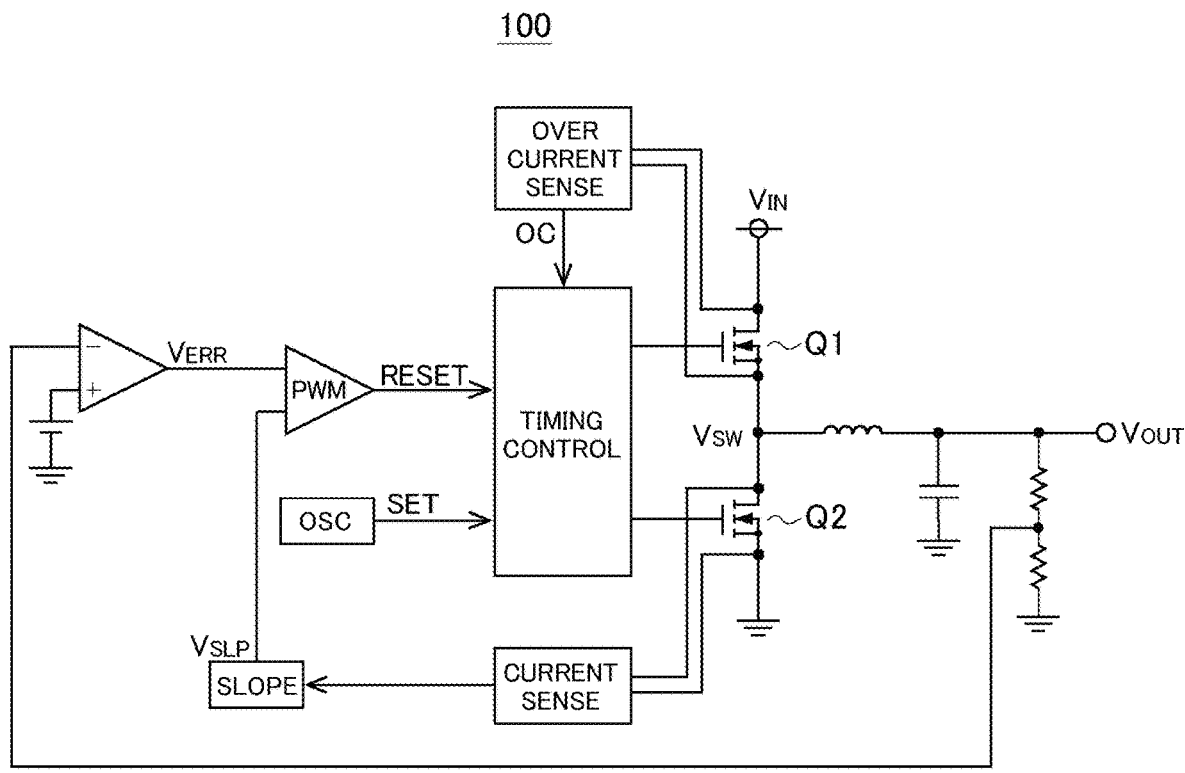
FIG. 11 is a diagram showing an example of a common configuration of a current-mode-control switching power supply device.

One possible solution here is to add the conventional overcurrent protection circuit shown in FIG. 11 exclusively to perform overcurrent protection operation to cope with an overcurrent state that occurs when the connection node between the high-side and low-side MOS transistors Q1 and Q2 is short-circuited to the ground potential. However, this solution is undesirable because it requires a greatly increased circuit scale.

Instead, the second practical example of overcurrent protection makes it possible, without greatly increasing the circuit scale, to perform overcurrent protection operation to cope with an overcurrent state that occurs when the connection node between the high-side and low-side MOS transistors Q1 and Q2 is short-circuited to the ground potential.

Figure 8:
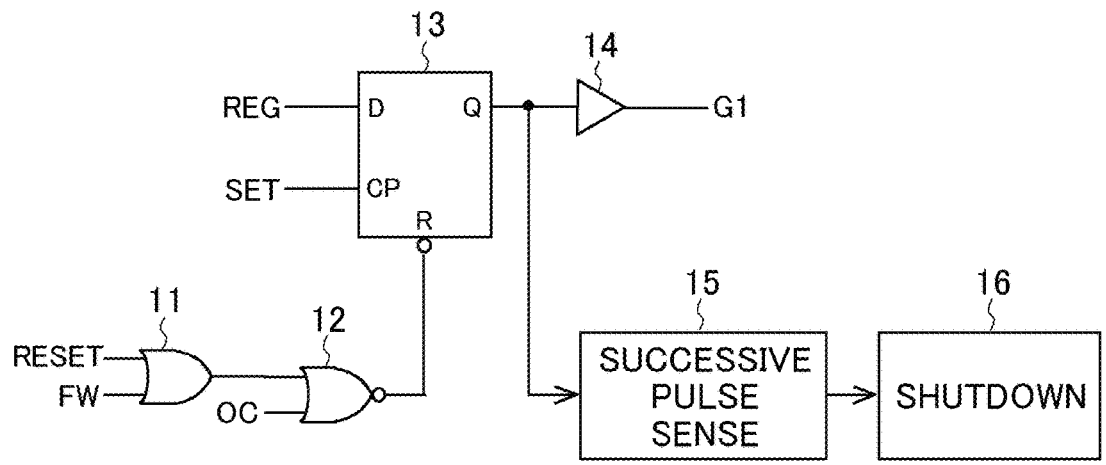
FIG. 8 is a diagram showing another example of the configuration of a principal portion of a timing control circuit.

FIG. 8 is a diagram showing the configuration of a principal portion of the timing control circuit 1 in a second practical example of overcurrent protection. As compared with the timing control circuit 1 configured as shown in FIG. 5, the timing control circuit 1 configured as shown in FIG. 8 additionally includes a successive pulse sense circuit 15 and a shutdown circuit 16.

The successive pulse sense circuit 15 monitors the output signal of the D flip-flop 13, and checks whether or not a plurality of pulses with the fixed width W1 are occurring successively at the switching frequency of normal operation.

The shutdown circuit 16 operates according to the result of the sensing by the successive pulse sense circuit 15. When a plurality of pulses with the fixed width W1 are sensed occurring successively at the switching frequency of normal operation by the successive pulse sense circuit 15, the shutdown circuit 16 stops the control operation by the timing control circuit 1 so that the high-side and low-side MOS transistors Q1 and Q2 stop their switching operation and the high-side MOS transistor Q1 turns OFF. Here, any overcurrent protection other than stopping the control operation of the timing control circuit 1 may be performed. For example, when a plurality of pulses with the fixed width W1 are sensed occurring successively at the switching frequency of normal operation by the successive pulse sense circuit 15, the electrical connection between the switching power supply device 101 and the supply source (for example, a battery) of the input voltage $V_{IN}$ may be cut off. Also in this case, the high-side and low-side MOS transistors Q1 and Q2 stop their switching operation and the high-side MOS transistor Q1 turns OFF.

The overcurrent protection operation for an ordinary overcurrent state is the same as that in the first practical example of overcurrent protection described previously, and therefore no overlapping description will be repeated. To follow is a description of the overcurrent protection operation in response to an overcurrent state that occurs when the connection node between the high-side and low-side MOS transistors Q1 and Q2 is short-circuited to the ground potential.

Figure 9:
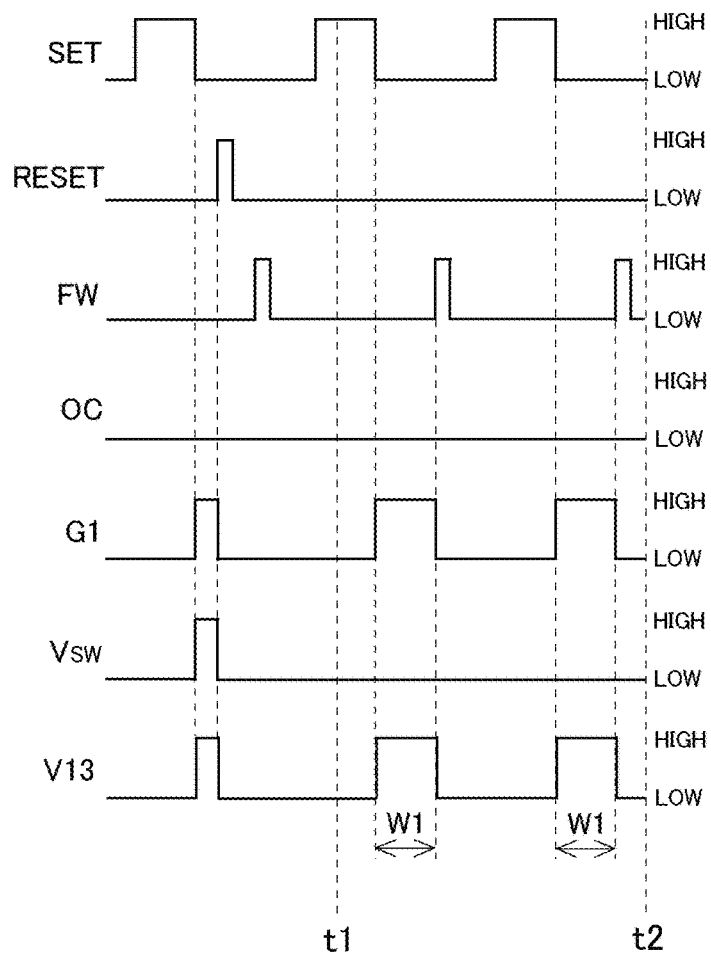
FIG. 9 is a timing chart showing an example of the operation of the timing control circuit shown in FIG. 8.

FIG. 9 is a timing chart showing an example of the operation of the timing control circuit 1 shown in FIG. 8. FIG. 9 shows operation observed in a situation where the connection node between the high-side and low-side MOS transistors Q1 and Q2 is short-circuited to the ground potential at time t1 and the overcurrent state due to the short circuit continues thereafter.

The overcurrent sense circuit 8 checks whether or not the current through the low-side MOS transistor Q2 is higher than the threshold value. Accordingly, in FIG. 9, the output signal OC is held at LOW level.

After time t1, the overcurrent state that occurs when the connection node between the high-side and low-side MOS transistors Q1 and Q2 is short-circuited to the ground potential continues, and thus no pulse appears in the reset signal RESET.

As a result, after time t1, two pulses with the fixed width W1 occur successively in the output signal V13 of the D flip-flop 13 at the switching frequency of normal operation, and at time t2, the timing control circuit 1 stops its control operation. That is, at time t2, overcurrent protection operation is performed that involves stopping the ON/OFF operation of the high-side MOS transistor Q1.

In the practical example described above, when a plurality of pulses with the fixed width W1 are sensed occurring successively at the switching frequency of normal operation, an overcurrent state where the duty ratio of the switching signal (gate signal G1) falls outside the normal modulation range is recognized. This may be generalized: when n or more pulses with the fixed width W1 are sensed occurring within m switching periods (a switching period being the reciprocal of the switching frequency) of normal operation (where m is an natural number such that n≤m), an overcurrent state where the duty ratio of the switching signal (gate signal G1) falls outside the normal modulation range may be recognized. The values of m and n can be set appropriately so that an overcurrent state where the duty ratio of the switching signal (gate signal G1) falls within the normal modulation range may not be erroneously detected as an overcurrent state where the duty ratio of the switching signal (gate signal G1) falls outside the normal modulation range. Sensing n or more pulses with the fixed width W1 occurring within m periods (a switching period being the reciprocal of the switching frequency) of normal operation (where m is an natural number such that n≤m) is tantamount to sensing an abnormal value in the duty ratio of the switching signal (gate signal G1).

Figure 15:
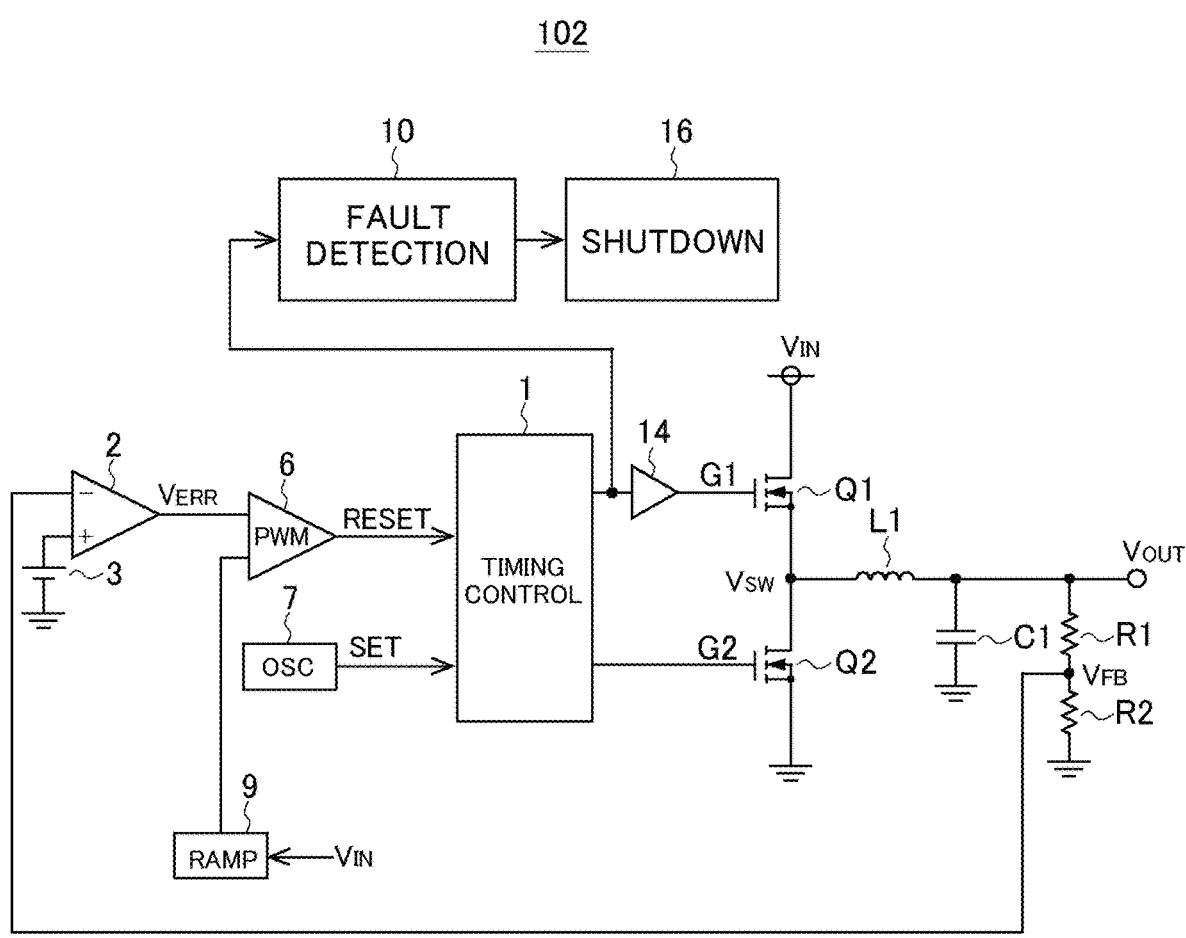
FIG. 15 is a diagram showing another example of the overall configuration of a switching power supply device.

Another Overall Configuration:

FIG. 15 is a diagram showing an example of the overall configuration of a voltage-mode-control switching power supply device (voltage-mode-control switching regulator). In FIG. 15, such components as find their counterparts in FIGS. 1 and 8 are identified by common reference signs, and no overlapping specific description will be repeated unless necessary. The switching power supply device 102 of this configuration example is a voltage-mode-control switching power supply device that performs step-down operation to step down an input voltage, and includes a timing control circuit 1, a high-side MOS transistor Q1, a low-side MOS transistor Q2, an inductor L1, an output capacitor C1, voltage division resistors R1 and R2, an error amplifier 2, a reference voltage source 3, a comparator 6, an oscillator 7, a ramp circuit 9, a fault detection circuit 10, an amplifier 14, and a shutdown circuit 16.

Between the timing control circuit 1 and the gate of the high-side MOS transistor Q1, the amplifier 14, which functions as a driver, is provided. A timing control signal output from the timing control circuit 1 is amplified by the amplifier 14 and is taken as a switching signal (gate signal G1), which is then fed to the gate of the high-side MOS transistor Q1. Also between the timing control circuit 1 and the gate of the low-side MOS transistor Q2, a similar driver is provided, though omitted from illustration. Incidentally, similar drivers may be provided also in the switching power supply device 101 shown in FIG. 1.

The ramp circuit 9 generates and outputs a ramp voltage with an inclination that is commensurate with the input voltage $V_{IN}$. The comparator 6 compares the ramp voltage output from the ramp circuit 9 with the error signal $V_{ERR}$ to generate a reset signal RESET, which is a comparison signal. The ramp circuit 9 performs feed forward control on the inclination of the ramp voltage when the input voltage $V_{IN}$ varies and thereby suppresses the variation of the error signal $V_{ERR}$.

The fault detection circuit 10 monitors the duty ratio of the timing control signal fed from the timing control circuit 1 to the amplifier 14 and, when the duty ratio (ON duty) of the timing control signal exceeds a predetermined value, recognizes a fault state where the duty ratio of the switching signal (gate signal G1) falls outside the normal modulation range.

The shutdown circuit 16 operates according to the result of the detection by the fault detection circuit 10. When a fault state where the duty ratio of the switching signal (gate signal G1) falls outside the normal modulation range is recognized by the fault detection circuit 10, the shutdown circuit 16 stops the control operation of the timing control circuit 1 so that the high-side and low-side MOS transistors Q1 and Q2 stop their switching operation. Here, any fault protection other than stopping the control operation of the timing control circuit 1 may be performed. For example, when a fault state where the duty ratio of the switching signal (gate signal G1) falls outside the normal modulation range is recognized by the fault detection circuit 10, the electrical connection between the switching power supply device 102 and the supply source (for example, a battery) of the input voltage $V_{IN}$ may be cut off. Also in this case, the high-side and low-side MOS transistors Q1 and Q2 stop their switching operation and the high-side MOS transistor Q1 turns OFF.

Figure 16:
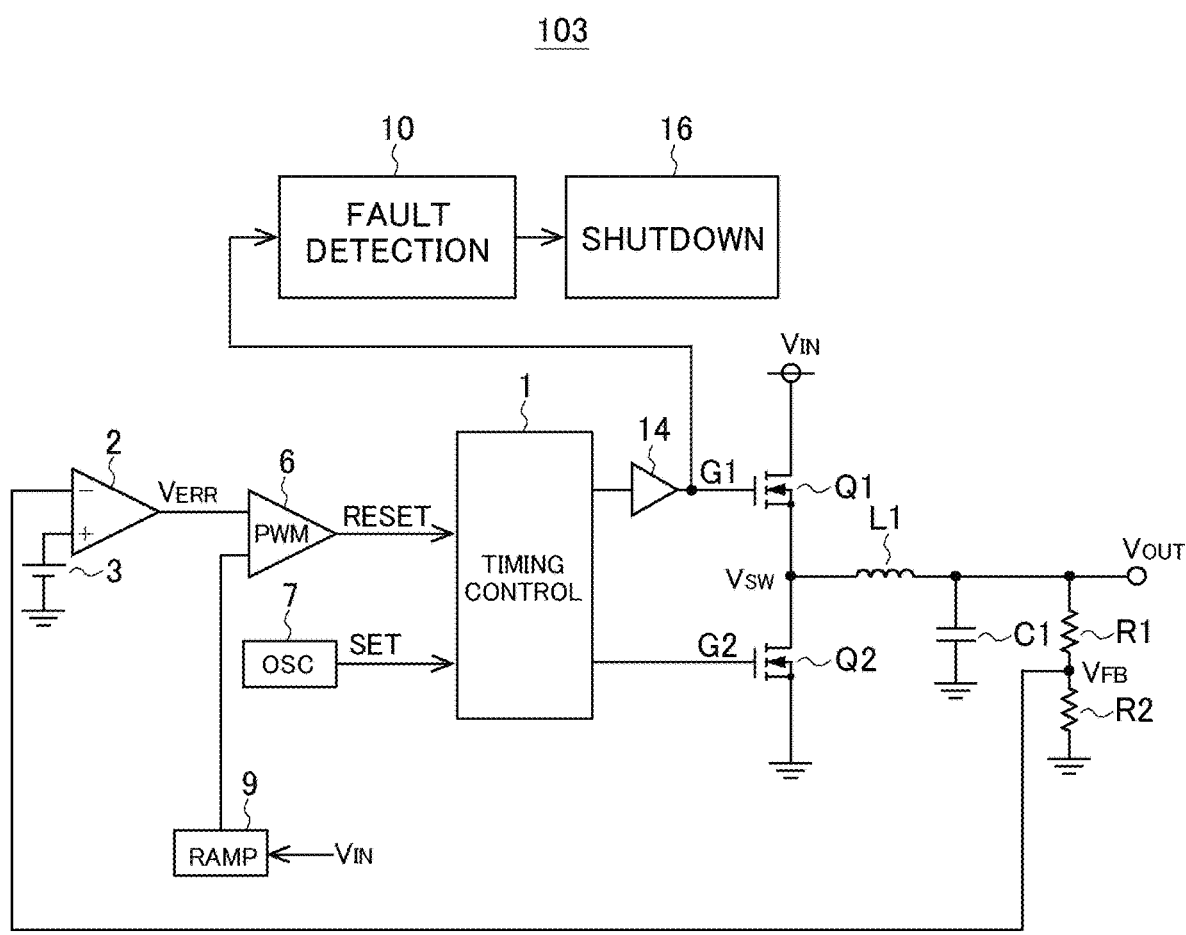
FIG. 16 is a diagram showing a modified example of the switching power supply device shown in FIG. 15.
Figure 17:
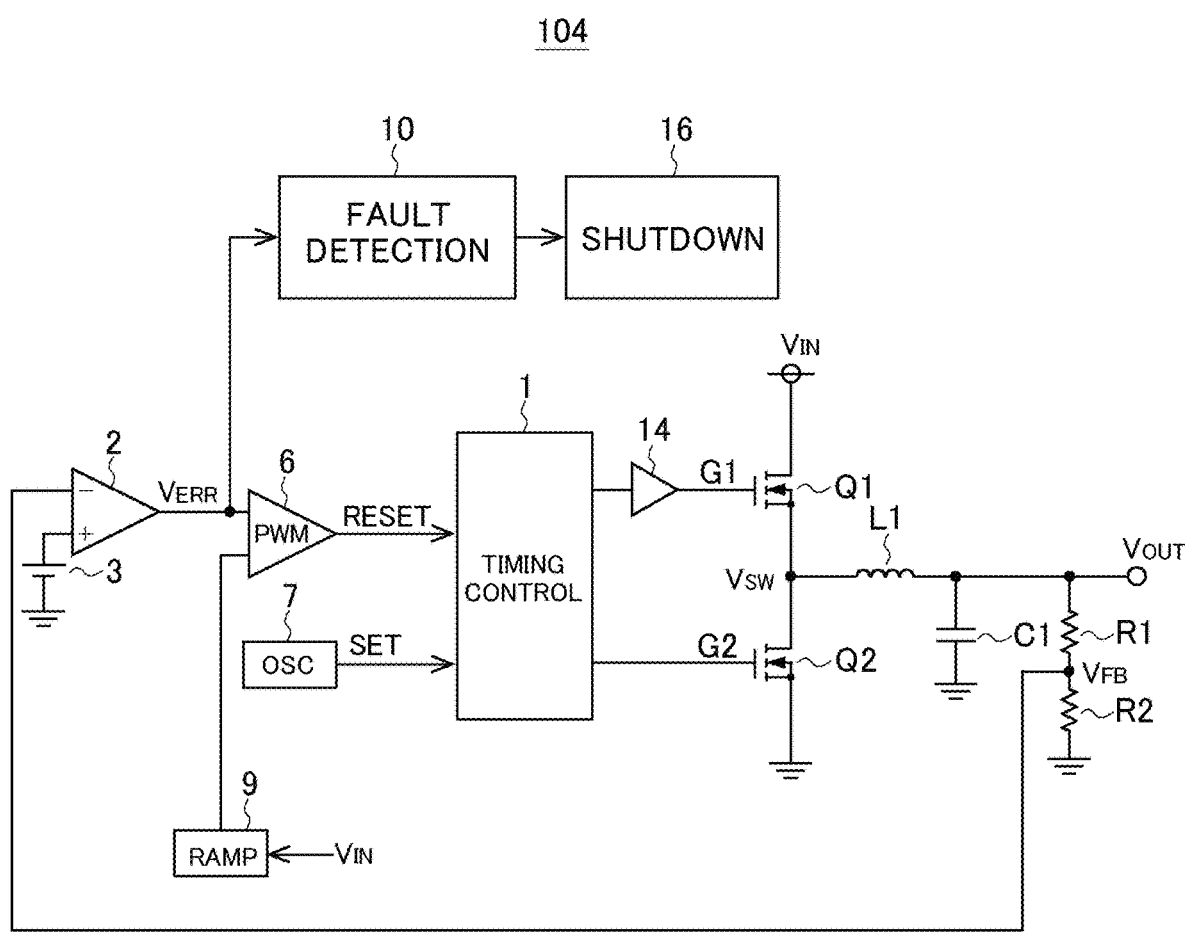
FIG. 17 is a diagram showing another modified example of the switching power supply device shown in FIG. 15.

In the switching power supply device 102, the fault detection circuit 10 monitors the duty ratio of the timing control signal fed from the timing control circuit 1 to the amplifier 14. Instead, as shown in the switching power supply device 103 shown in FIG. 16, the fault detection circuit 10 may monitor the duty ratio of the switching signal (gate signal G1), or as shown in the switching power supply device 104 shown in FIG. 17, the fault detection circuit 10 may monitor the value of the error signal $V_{ERR}$. The error signal $V_{ERR}$ is a control signal that is used to generate the switching signal (gate signal G1), and there is a correlation between the value of the error signal $V_{ERR}$ and the duty ratio of the switching signal (gate signal G1); thus, monitoring the value of the error signal $V_{ERR}$ instead of the duty ratio of the timing control signal or the switching signal (gate signal G1) can achieve similar fault protection.

Figure 10:
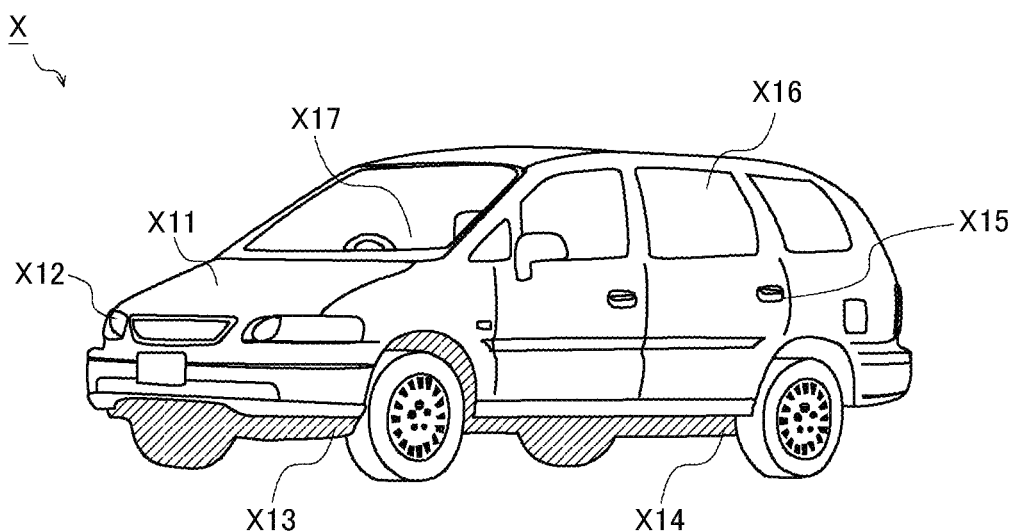
FIG. 10 is an exterior view showing one example of the configuration of a vehicle furnished with vehicle-mounted appliances.

Application:

Next, an example of application of the switching power supply devices 101 to 104 described above will be described. FIG. 10 is an exterior view showing an example of the configuration of a vehicle furnished with vehicle-mounted appliances. The vehicle X of this configuration example is furnished with vehicle-mounted appliances X11 to X17 and a battery (unillustrated) for supplying the vehicle-mounted appliances X11 to X17 with electric power.

The vehicle-mounted appliance X11 is an engine control unit which performs control related to an engine (injection control, electronic throttle control, idling control, oxygen sensor heater control, automatic cruising control, and the like).

The vehicle-mounted appliance X12 is a lamp control unit which controls the lighting and extinguishing of HIDs (high-intensity discharge lamps), DRLs (daytime running lamps), and the like.

The vehicle-mounted appliance X13 is a transmission control unit which performs control related to transmission.

The vehicle-mounted appliance X14 is a body control unit which performs control related to the movement of the vehicle X (ABS (anti-lock braking system) control, EPS (electric power steering) control, electronic suspension control, and the like).

The vehicle-mounted appliance X15 is a security control unit which controls the driving of a door lock, a burglar alarm, and the like.

The vehicle-mounted appliance X16 comprises electronic appliances that are incorporated, as standard features or factory-furnished options into the vehicle X at factory shipment, such as wipers, power door mirrors, power windows, a power sliding roof, power seats, an air conditioner, and the like.

The vehicle-mounted appliance X17 comprises electronic appliances that are mounted on the vehicle X as the user likes, such as vehicle-mounted AV (audiovisual) equipment, a car navigation system, an ETC (electronic toll collection) system, and the like.

Any of the switching power supply devices 101 to 104 described above can be incorporated into any of the vehicle-mounted appliances X11 to X17.

Other Modifications:

The present invention can be implemented with any configurations other than those specifically described by way of embodiments above, and allows for many modifications made without departing from the spirit of the present invention.

For example, while the above embodiments deal with step-down switching regulators as examples, this is not meant to limit the application of the present invention: the present invention finds application in switching regulators in general.

As mentioned above, the above embodiments should be considered to be in every aspect illustrative and not restrictive, and it should be understood that the technical scope of the present invention is limited not by the description of embodiments given above by the appended claims and encompasses any modifications in the scope and sense equivalent to those of the appended claims.

Synopsis:

According to one aspect of what is disclosed herein, a switching regulator control circuit as is used in a switching regulator that converts an input voltage into an output voltage by the switching of a switching device in order to generate a switching signal for controlling the ON/OFF operation of the switching device includes: a fault detector configured to detect, based on the duty ratio of the switching signal or a variable correlated to the duty ratio and included in a control signal used to generate the switching signal, a fault state where the duty ratio falls outside the normal modulation range; and a fault protector configured to stop the switching of the switching device when the fault detector detects the fault state. (A first configuration.)

In the switching regulator control circuit of the first configuration described above, the normal modulation range may be a modulation range of the duty ratio that appears in response to extraneous disturbances expected during the operation of the switching regulator that includes the switching regulator control circuit. (A second configuration.) Here, extraneous disturbances expected during the operation of the switching regulator that includes the switching regulator control circuit includes, for example, variation of the input voltage and variation of the load current.

In the switching regulator control circuit of the first or second configuration described above, the fault protector may detect the fault state based on the result of detection of the pulse width of the switching signal, a voltage correlated to the pulse width, or a current correlated to the pulse width. (A third configuration.)

In the switching regulator control circuit of any of the first to third configurations described above, the upper limit of the pulse width may be limited by a fixed width, and the fault detector may detect the fault state when n or more pulses with the fixed width occur in the switching signal within m switching periods of normal operation (where m is an natural number such that n≤m). (A fourth configuration.)

In the switching regulator control circuit of the fourth configuration described above, a plurality of values may be set as the fixed width so that and any one of the plurality of values can be selected as the fixed width. (A fifth configuration.)

In the switching regulator control circuit of the fourth or fifth configuration described above, the value of the fixed width may be a function of at least either of the input voltage and the output voltage of the switching regulator that includes the switching regulator control circuit. (A sixth configuration.)

According to another aspect of what is disclosed herein, a current-mode-control switching power supply device includes: a first switch having a first terminal thereof connected to a first application terminal to which an input voltage is applied; a second switch having a first terminal thereof connected to a second terminal of the first switch and having a second terminal thereof connected to a second application terminal to which a voltage lower than the input voltage is applied; a current sensor configured to sense the current through the second switch; an overcurrent sensor configured to sense an overcurrent through the second switch; and a controller configured to control the first and second switches according to the current sensed by the current sensor. Here, the controller includes a slope voltage generator configured to accumulate information on the current sensed by the current sensor during a predetermined period in which the first switch is OFF to generate a slope voltage based on the accumulated information on the current, and the controller is configured to control the first and second switches according to the slope voltage. Moreover, the controller is configured to limit to a fixed width the pulse width of a pulse occurring in a switching signal for controlling the ON/OFF operation of the first and second switches if continuing to control the first and second switches according to the slope voltage causes the pulse width of the pulse occurring in the switching signal to exceed the fixed width. Furthermore, the controller is configured to inhibit any pulse from occurring in the switching signal during a period in which an overcurrent is sensed by the overcurrent sensor and to stop the ON/OFF operation of the first switch to turn the first switch OFF when a plurality of pulses with the fixed width are occurring successively in the switching signal at the switching frequency of normal operation. (A seventh configuration.)

In the current-mode-control switching power supply device of the seventh configuration described above, the controller may include: an error amplifier configured to generate an error signal that is commensurate with the difference between a voltage commensurate with the output voltage of the current-mode-control switching power supply device and a reference voltage; a comparator configured to compare the slope voltage with the error signal to generate a reset signal which is a comparison signal; an oscillator configured to generate a set signal which is a clock signal with a predetermined frequency; and a timing control circuit configured to control the ON/OFF operation of the first switch and the ON/OFF operation of the second switch according to the set signal and the reset signal. (An eighth configuration.)

In the current-mode-control switching power supply device of the seventh or eighth configuration described above, the value of the fixed width may be a function of the input voltage and the output voltage of the current-mode-control switching power supply device. (A ninth configuration.)

In the current-mode-control switching power supply device of any of the seventh to ninth configurations described above, the second switch may be a MOS transistor, the current sensor may sense the current through the second switch by using the voltage across the ON resistance of the MOS transistor, and the overcurrent sensor may sense the overcurrent through the second switch by using the voltage across the ON resistance of the MOS transistor. (A tenth configuration.)

According to yet another aspect of what is disclosed herein, a vehicle-mounted appliance includes a switching regulator including a switching regulator control circuit of any one of the first to sixth configurations described above along with a switching device whose ON/OFF operation is controlled by a switching signal output from the switching regulator control circuit, or includes a current-mode-control switching power supply device of any one of the seventh to tenth configurations described above. (An eleventh configuration.)

According to still another aspect of what is disclosed herein, a vehicle includes a vehicle-mounted appliance of the eleventh configuration described above along with a battery for supplying the vehicle-mounted appliance with electric power. (A twelfth configuration.)

What is claimed is:

1. A switching regulator control circuit for use in a switching regulator that includes: a first switch having a first terminal thereof connected to a first application terminal to which an input voltage is applied; a second switch having a first terminal thereof connected to a second terminal of the first switch and having a second terminal thereof connected to a second application terminal to which a voltage lower than the input voltage is applied; and an overcurrent sensor configured to sense an overcurrent through the second switch based on a potential difference between the first terminal and the second terminal of the second switch, the switching regulator control circuit generating a switching signal for controlling ON/OFF operation of the first switch, the switching regulator control circuit comprising:
a fault detector configured to detect, based on a duty ratio of the switching signal or a variable correlated to the duty ratio and included in a control signal used to generate the switching signal, a fault state where the duty ratio falls outside a normal modulation range; and
a fault protector configured to stop switching of the first switch to turn the first switch OFF when the fault detector detects the fault state,
wherein:
the switching regulator control circuit is configured to inhibit any pulse from occurring in the switching signal during a period in which an overcurrent is sensed by the overcurrent sensor,
the fault detector is configured to detect the fault state when n or more pulses with a pulse width outside a normal range occur in the switching signal within m switching periods of normal operation (where n is a non-zero natural number less than or equal to m),
an upper limit of the pulse width of the switching signal is limited to a fixed width, and
a plurality of values are set as the fixed width, and any one of the plurality of values can be selected as the fixed width.

2. The switching regulator control circuit of claim 1, wherein the normal modulation range is a modulation range of the duty ratio that appears in response to extraneous disturbances expected during operation of the switching regulator that includes the switching regulator control circuit.

3. The switching regulator control circuit of claim 1, wherein the fault protector detects the fault state based on a result of detection of a pulse width of the switching signal, a voltage correlated to the pulse width, or a current correlated to the pulse width.

4. A switching regulator control circuit for use in a switching regulator that includes: a first switch having a first terminal thereof connected to a first application terminal to which an input voltage is applied; a second switch having a first terminal thereof connected to a second terminal of the first switch and having a second terminal thereof connected to a second application terminal to which a voltage lower than the input voltage is applied; and an overcurrent sensor configured to sense an overcurrent through the second switch based on a potential difference between the first terminal and the second terminal of the second switch, the switching regulator control circuit generating a switching signal for controlling ON/OFF operation of the first switch, the switching regulator control circuit comprising:
a fault detector configured to detect, based on a duty ratio of the switching signal or a variable correlated to the duty ratio and included in a control signal used to generate the switching signal, a fault state where the duty ratio falls outside a normal modulation range; and
a fault protector configured to stop switching of the first switch to turn the first switch OFF when the fault detector detects the fault state,
wherein:
the switching regulator control circuit is configured to inhibit any pulse from occurring in the switching signal during a period in which an overcurrent is sensed by the overcurrent sensor,
the fault detector is configured to detect the fault state when n or more pulses with a pulse width outside a normal range occur in the switching signal within m switching periods of normal operation (where n is a non-zero natural number less than or equal to m), an upper limit of the pulse width of the switching signal is limited to a fixed width, and a value of the fixed width is a function of at least either of the input voltage or the output voltage of the switching regulator that includes the switching regulator control circuit.

5. The switching regulator control circuit of claim 4, wherein the normal modulation range is a modulation range of the duty ratio that appears in response to extraneous disturbances expected during operation of the switching regulator that includes the switching regulator control circuit.

6. The switching regulator control circuit of claim 4, wherein the fault protector detects the fault state based on a result of detection of a pulse width of the switching signal, a voltage correlated to the pulse width, or a current correlated to the pulse width.

7. A switching regulator control circuit for use in a switching regulator that includes: a first switch having a first terminal thereof connected to a first application terminal to which an input voltage is applied; a second switch having a first terminal thereof connected to a second terminal of the first switch and having a second terminal thereof connected to a second application terminal to which a voltage lower than the input voltage is applied; and an overcurrent sensor configured to sense an overcurrent through the second switch and configured to monitor a potential difference between the first and second terminals of the second switch, the switching regulator control circuit generating a switching signal for controlling ON/OFF operation of the first switch, wherein the switching regulator control circuit comprises:

a fault detector configured to detect, based on a duty ratio of the switching signal or a variable correlated to the duty ratio and included in a control signal used to generate the switching signal, a fault state where the duty ratio falls outside a normal modulation range; and a fault protector configured to stop the switching of the first switch to turn the first switch OFF when the fault detector detects the fault state, wherein:

the switching regulator control circuit is configured to inhibit any pulse from occurring in the switching signal during a period in which an overcurrent is sensed by the overcurrent sensor, the switching regulator control circuit is configured to limit an upper limit of a pulse width of the switching signal to a fixed width, and a plurality of values are set as the fixed width, and any one of the plurality of values can be selected as the fixed width.

8. The switching regulator control circuit of claim 7, wherein the fault detector is configured to detect the fault state when n or more pulses with the fixed width occur in the switching signal within m switching periods of normal operation (where n is a non-zero natural number less than or equal to m) during a continuous period in which no overcurrent is sensed by the overcurrent sensor.

9. The switching regulator control circuit of claim 8, wherein the fault detector is configured to detect the fault state when pulses with the fixed width are occurring successively in the switching signal at a switching frequency of normal operation during a continuous period in which no overcurrent is sensed by the overcurrent sensor.

10. A current-mode-control switching power supply device, comprising: a controller including the switching regulator control circuit of claim 7, the current-mode switching power supply device further including: the first switch having the first terminal thereof connected to the first application terminal to which the input voltage is applied; the second switch having the first terminal thereof connected to the second terminal of the first switch and having the second terminal thereof connected to the second application terminal to which the voltage lower than the input voltage is applied; a current sensor configured to sense the current through the second switch; and the overcurrent sensor configured to sense the overcurrent through the second switch, wherein the controller is configured to control the first and second switches according to the current sensed by the current sensor, and wherein the controller includes a slope voltage generator configured to accumulate information on the current sensed by the current sensor during a predetermined period in which the first switch is OFF to generate a slope voltage based on the accumulated information on the current, the controller being configured to control the first and second switches according to the slope voltage.

11. The current-mode-control switching power supply device of claim 10, wherein the controller includes:

an error amplifier configured to generate an error signal that is commensurate with a difference between a voltage commensurate with an output voltage of the current-mode-control switching power supply device and a reference voltage;

a comparator configured to compare the slope voltage with the error signal to generate a reset signal, the reset signal being a comparison signal;

an oscillator configured to generate a set signal, the set signal being a clock signal with a predetermined frequency; and a timing control circuit configured to control the ON/OFF operation of the first switch and ON/OFF operation of the second switch according to the set signal and the reset signal.

12. The current-mode-control switching power supply device of claim 10, wherein the second switch is a MOS transistor, the current sensor senses the current through the second switch by using a voltage across an ON resistance of the MOS transistor, and the overcurrent sensor senses the overcurrent through the second switch by using the voltage across the ON resistance of the MOS transistor.

13. A vehicle-mounted appliance including a switching regulator, wherein the switching regulator comprises:

a controller including the switching regulator control circuit of claim 7, the switching regulator further including:

the first switch having the first terminal thereof connected to the first application terminal to which the input voltage is applied;

the second switch having the first terminal thereof connected to the second terminal of the first switch and having the second terminal thereof connected to the second application terminal to which the voltage lower than the input voltage is applied; and the overcurrent sensor configured to sense the overcurrent through the second switch;

wherein the controller is configured to control the first and second switches.

14. A vehicle, comprising:

the vehicle-mounted appliance of claim 13; and a battery for supplying the vehicle-mounted appliance with electric power.

15. A switching regulator control circuit for use in a switching regulator that includes: a first switch having a first terminal thereof connected to a first application terminal to which an input voltage is applied; a second switch having a first terminal thereof connected to a second terminal of the first switch and having a second terminal thereof connected to a second application terminal to which a voltage lower than the input voltage is applied; and an overcurrent sensor configured to sense an overcurrent through the second switch and configured to monitor a potential difference between the first and second terminals of the second switch, the switching regulator control circuit generating a switching signal for controlling ON/OFF operation of the first switch, wherein the switching regulator control circuit comprises:
 a fault detector configured to detect, based on a duty ratio of the switching signal or a variable correlated to the duty ratio and included in a control signal used to generate the switching signal, a fault state where the duty ratio falls outside a normal modulation range; and
 a fault protector configured to stop the switching of the first switch to turn the first switch OFF when the fault detector detects the fault state,
 wherein:
 the switching regulator control circuit is configured to inhibit any pulse from occurring in the switching signal during a period in which an overcurrent is sensed by the overcurrent sensor,
 the switching regulator control circuit is configured to limit an upper limit of a pulse width of the switching signal to a fixed width, and
 a value of the fixed width is a function of at least either of the input voltage and the output voltage of the switching regulator that includes the switching regulator control circuit.

16. The switching regulator control circuit of claim 15, wherein the fault detector is configured to detect the fault state when n or more pulses with the fixed width occur in the switching signal within m switching periods of normal operation (where n is a non-zero natural number less than or equal to m) during a continuous period in which no overcurrent is sensed by the overcurrent sensor.

17. The switching regulator control circuit of claim 16, wherein the fault detector is configured to detect the fault state when pulses with the fixed width are occurring successively in the switching signal at a switching frequency of normal operation during a continuous period in which no overcurrent is sensed by the overcurrent sensor.

18. A current-mode-control switching power supply device, comprising: a controller including the switching regulator control circuit of claim 15, the current-mode switching power supply device further including: the first switch having the first terminal thereof connected to the first application terminal to which the input voltage is applied; the second switch having the first terminal thereof connected to the second terminal of the first switch and having the second terminal thereof connected to the second application terminal to which the voltage lower than the input voltage is applied; a current sensor configured to sense the current through the second switch; and the overcurrent sensor configured to sense the overcurrent through the second switch, wherein the controller is configured to control the first and second switches according to the current sensed by the current sensor; and wherein the controller includes a slope voltage generator configured to accumulate information on the current sensed by the current sensor during a predetermined period in which the first switch is OFF to generate a slope voltage based on the accumulated information on the current; the controller being configured to control the first and second switches according to the slope voltage.

19. The current-mode-control switching power supply device of claim 18, wherein the controller includes:
 an error amplifier configured to generate an error signal that is commensurate with a difference between a voltage commensurate with an output voltage of the current-mode-control switching power supply device and a reference voltage;
 a comparator configured to compare the slope voltage with the error signal to generate a reset signal, the reset signal being a comparison signal;
 an oscillator configured to generate a set signal, the set signal being a clock signal with a predetermined frequency; and
 a timing control circuit configured to control the ON/OFF operation of the first switch and ON/OFF operation of the second switch according to the set signal and the reset signal.

20. The current-mode-control switching power supply device of claim 18, wherein
 the second switch is a MOS transistor,
 the current sensor senses the current through the second switch by using a voltage across an ON resistance of the MOS transistor, and
 the overcurrent sensor senses the overcurrent through the second switch by using the voltage across the ON resistance of the MOS transistor.

21. A vehicle-mounted appliance including a switching regulator, wherein the switching regulator comprises:
 a controller including the switching regulator control circuit of claim 15, the switching regulator further including:
 the first switch having the first terminal thereof connected to the first application terminal to which the input voltage is applied;
 the second switch having the first terminal thereof connected to the second terminal of the first switch and having the second terminal thereof connected to the second application terminal to which the voltage lower than the input voltage is applied; and
 the overcurrent sensor configured to sense the overcurrent through the second switch;
 wherein the controller is configured to control the first and second switches.

22. A vehicle, comprising:
 the vehicle-mounted appliance of claim 21; and
 a battery for supplying the vehicle-mounted appliance with electric power.

* * * * *